United States Patent [19]

Shinozaki et al.

[11] Patent Number: 4,980,260

[45] Date of Patent: Dec. 25, 1990

[54] MULTI-COLOR IMAGE-FORMING METHOD WITH MICROCAPSULE POSITIVE DIAZOTYPE COLOR IMAGE FORMATION AND POSITIVE LIGHT-SOLUBILIZING COLOR IMAGE FORMATION

[75] Inventors: Fumiaki Shinozaki; Mikio Totsuka; Tomizo Namiki, all of Shizuoka, Japan

[73] Assignee: Fuji Photo Film Co., Ltd., Kanagawa, Japan

[21] Appl. No.: 185,225

[22] Filed: Apr. 25, 1988

[30] Foreign Application Priority Data

Apr. 23, 1987 [JP] Japan .................... 62-100428

[51] Int. Cl.$^5$ .................... G03C 7/00; G03C 5/18
[52] U.S. Cl. .................... 430/138; 430/142; 430/143; 430/145; 430/156; 430/160; 430/162; 430/166; 430/171; 430/192; 430/152
[58] Field of Search ............... 430/138, 142, 143, 145

[56] References Cited

U.S. PATENT DOCUMENTS

| | | | |
|---|---|---|---|
| 2,528,395 | 10/1950 | Slifkin | 430/160 |
| 3,495,979 | 2/1970 | Laridon et al. | 96/33 |
| 3,620,739 | 11/1971 | Gray | 430/142 |
| 3,640,992 | 2/1972 | Sus et al. | 260/141 |
| 3,660,097 | 5/1972 | Mainthia | 96/91 |
| 3,687,663 | 8/1972 | Bloom | 96/33 |
| 3,721,557 | 3/1973 | Inoue | 96/28 |
| 3,779,778 | 12/1978 | Smith et al. | 96/115 |
| 3,869,292 | 3/1975 | Peters | 96/115 |
| 4,101,323 | 7/1978 | Buhr et al. | 96/35 |
| 4,168,978 | 9/1979 | Koenig | 430/142 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,311,782 | 1/1982 | Buhr et al. | 430/270 |
| 4,400,456 | 8/1983 | Matsuda et al. | 430/138 |
| 4,576,831 | 3/1986 | Hosoi et al. | 427/40 |
| 4,650,740 | 3/1987 | Usami et al. | 430/176 |
| 4,771,032 | 9/1988 | Yamaguchi et al. | 430/142 |

FOREIGN PATENT DOCUMENTS 2623434 12/1977 Fed. Rep. of Germany ...... 430/143

OTHER PUBLICATIONS

Schreiber, D. et al., "Multicolor Diazo Imaging Elements", *Research Disclosure*, pp. 53–56, 1975.
Anon, "Color with Diazo Film", *Camera*, pp. 48–49, 1964.
Derwent Abstract for Japanese Pub. #60-4092 (Dainippon Printing KK), 1/1985.

*Primary Examiner*—Charles L. Bowers, Jr.
*Attorney, Agent, or Firm*—Sughrue, Mion, Zinn, MacPeak & Seas

[57] ABSTRACT

A multicolor image-forming method which comprises image-exposing a light-sensitive heat-sensitive recording material having a diazo compound and a coupling component on a support using a positive image followed by developing to form a color image, image-exposing a light-solubilizing color image-forming material having a coloring material on a substantially transparent support using a positive image followed by developing to form a color image, and superposing the light-solubilizing color image-forming material having the color image on the light-sensitive heat-sensitive recording material having the color image or, further, heat-pressing the light-solubilizing color image-forming material having the color image superposed on the light-sensitive heat-sensitive recording material having the color image.

4 Claims, No Drawings

MULTI-COLOR IMAGE-FORMING METHOD WITH MICROCAPSULE POSITIVE DIAZOTYPE COLOR IMAGE FORMATION AND POSITIVE LIGHT-SOLUBILIZING COLOR IMAGE FORMATION

FIELD OF THE INVENTION

This invention relates to a multicolor image-forming method and more particularly, the invention relates to a multicolor image-forming method which is mainly used for two color proofing.

BACKGROUND OF THE INVENTION

Hitherto, as a proofing method for color prints, a method of performing proof printing using a print proofreading machine or a main printing machine has been used. However, proof printing by a proofing method is expensive, printing requires a long period of time, and also there is a limit on the reliability thereof.

On the other hand, various color proofing methods by photographic process having been employed as a simple and easy method in place of the aforesaid printing methods.

As the color proofing method by photographic process, there is a color proofing method using a photopolymer (i.e., pre-press proof), an overlay method and a surprint method.

In the overlay method, plural color proofing sheets each having separation images of each color on a transparent support are prepared and color proofing is performed by superposing these sheets (the assembly of the sheets thus obtained is called a "color test sheet").

The overlay method has the advantages that the method is very simple and inexpensive and the method can be used for continuous inspection by superposing 2 single color sheets or 3 single color sheets only each time, but has the disadvantages that the color test sheet obtained becomes dark to some extent by the superposed synthetic resin sheets and also the incident light is reflected by several sheets to give luster, whereby the impression received from the color test sheet is very different from the quality impression of a print printed by an ordinary printing machine.

On the other hand, in the surprint method, plural single-color layers are superposed on a single support and for that purpose, various kinds of toners are applied onto a common opaque film base or plural light-sensitive layers each corresponding to each color are formed, in succession, on an opaque film base. Details of these methods are described, for example, in U.S. Pat. Nos. 3,671,236 and 3,136,637.

The surprint method has the advantage that the color density is not influenced by the synthetic resin base. Also, the surprint method is more similar to the original printing method and further has the advantage that the occurrence of color stain in the case of superposing sheets as in the aforesaid overlay method is inhibited.

Furthermore, a method of imagewise exposing each of the light-sensitive transfer materials each having, in succession, a peelable layer composed of an organic polymer, a coloring material layer, and a light-sensitive layer on a temporary support, developing the light-sensitive transfer material to form color images on the peelable layer, and then transferring the color images onto an optional support (permanent support) each time by using an adhesive is well known as described in Japanese Patent Publication Nos. 15326/71 and 441/74.

This method has the advantage of being usable for various operations such as an overlay type and surprint type as color proof, but has the disadvantage that the method is troublesome, since an adhesive must be used at each transfer of color images and also since it is difficult to keep the preciseness of matching the positions of color images when transferring images of each color.

For removing the aforesaid troublesome defects of these methods, a method of transferring images formed by applying heat and pressure onto a permanent support is disclosed in Japanese Pat. Application (OPI) Nos. 41830/72, 9337/73, and 5101/76 (the term "OPI" as used herein refers to a "published unexamined Japanese patent application"). In particular, Japanese Pat. Application (OPI) No. 5101/76 discloses that a heat-fusible polymer layer is formed on a permanent support as adhesive and also Japanese Pat. Application (OPI) No. 41830/72 discloses a method of directly transferring images onto a permanent support such as an art paper or a coated paper.

However, these methods have various disadvantages. That is, these are the problems that the final image transferred onto a permanent support is right and left reversed and also when a heat-fusible polymer is used as an adhesive, an increase in transfer temperature is required, since the melting point thereof is generally high, whereby the dimensional stability of support is reduced by the influence of heat to cause discrepancies in the matching of the transferred position of each color images. On the other hand, when a heat-fusible polymer having low melting point is used as an adhesive, the surface of the images transferred becomes adhesive and thus the surface is liable to be injured.

For overcoming the aforesaid difficulty, a method of once transferring images onto a temporary image-receiving sheet before transferring the images onto a permanent support was previously proposed in Japanese Pat. Application (OPI) No. 97140/84 (corresponding to U.S. Pat. No. 4,482,625) by the same assignee. That is, according to this method, a temporary image-receiving sheet composed of a support having formed thereon an image-receiving layer composed of a photopolymerizable material is prepared, images of each color are once transferred onto the temporary image-receiving sheet before being transferred onto a permanent support, the color images thus formed on the image-receiving sheet are then retransferred onto a permanent support, and the images thus transferred are overall light-exposed to harden the image-receiving layer composed of the photopolymerizable material thus transferred onto the permanent support.

The above-described image transfer method using a temporary image-receiving sheet (hereinafter referred to simply as an image-receiving sheet) is very effective for solving the aforesaid problem. That is, by utilizing the aforesaid method, a correct image for an original can be obtained on a permanent support. Since the photopolymerizable image-receiving layer of the image-receiving sheet contains an ethylenic polyfunctional monomer, the photopolymerizable image-receiving layer itself is soft, image transfer is possible at a low temperature, and after transferring images thereon, the image-receiving layer having transferred images thereon can be easily hardened by overall light exposure. That is, the aforesaid methods have such advantages that adhesion does not occur after transferring images and the resistance to injury of the final images obtained is high.

In the image-receiving sheet used for the method described in Japanese Pat. Application (OPI) No. 97140/84 described above, the adhesive strength between the photopolymerizable image-receiving layer (i.e., photopolymerizable adhesive layer) and the support is very high in the unexposed state. Accordingly, in transferring the photopolymerizable adhesive layer having images received thereon onto a final support, peeling stripes are liable to form on the surface of the transferred image-carrying photopolymerizable adhesive layer if the support of the image-receiving sheet material is peeled off before applying light exposure. For overcoming this problem, Japanese Pat. Application (OPI) No. 97140/84 provides a method wherein after intimately contacting an image-receiving photopolymerizable adhesive layer onto a final support, the photopolymerizable adhesive layer is first hardened by applying thereto overall light exposure whereby the adhesion between the photopolymerizable adhesive layer and the support for the image-receiving sheet is reduced, and then the image-receiving sheet support is removed.

However, these surprint methods have disadvantages in that they are expensive and they cannot satisfy the need for both high quality and low cost in color proofing by these photographic processes.

SUMMARY OF THE INVENTION

An object of this invention is, therefore, to provide a multicolor image-forming method for color proofing without being accompanied by the aforesaid disadvantages in the conventional techniques.

As the result of various investigations for obtaining a multicolor image-forming method for color proof capable of satisfying the need for both high image quality and low cost, the inventors have discovered that the aforesaid object can be attained by a multicolor image-forming method which comprises image-exposing a light-sensitive heat-sensitive recording material having a diazo compound and a coupling component on a support using a positive image followed by developing to form a color image, image-exposing a light-solubilizing color image-forming material having a coloring material on a substantially transparent support using a positive image followed by development to form a color image, and superposing the light-solubilizing color image-forming material having the color image on the light-sensitive heat-sensitive recording material having the color image, or further heat-pressing the light-solubilizing color image-forming material having the color image superposed on the light-sensitive heat-sensitive recording material having the color image.

DETAILED DESCRIPTION OF THE INVENTION

The multicolor color image-forming method of this invention is very effective in a two-color image-forming method for color proofing.

The light-sensitive heat-sensitive recording materials which are used in the present invention are described, for example, in Japanese Pat. Application (OPI) Nos. 123086/82, 44141/82, 142636/82, 192944/82, and 190886/84 and Gazo Denshi Gakkai Shi (Journal of Image Electron Society), 11, 290 (1982).

The light-sensitive heat-sensitive recording material for use in this invention is explained below.

As a paper for the support of the recording material, a heat-extract neutral paper having pH of from 6 to 9 sized by a neutral sizing agent such as alkylketene dimer, etc., as described in Japanese Pat. Application (OPI) No. 14281/80 is advantageous in terms of storage stability.

Also, a paper having an optical surface roughness of less than 8 $\mu$m and a thickness of from 40 to 75 $\mu$m described in Japanese Pat. Application (OPI) No. 136492/83, a paper having a density of less than 0.9 g/cm$^3$ and an optical contact ratio of above 15% described in Japanese Pat. Application (OPI) No. 69091/83, a paper made from a pulp subjected to beating treatment and to above 400 cc Canadian standard freeness (JIS P8121 (JIS refers to Japanese Industrial Standard)) or paper treated to prevent the permeation of coating solution described in Japanese Pat. Application No. 69097/83, a paper made by a Yankee paper machine, the luster surface thereof being used as the coating surface for improving color density and resolving power described in Japanese Pat. Application (OPI) No. 65695/83, and a paper subjected to a corona discharge treatment for improving coating aptitude described in Japanese Pat. Application (OPI) No. 35985/84 can be used in this invention with good results. Other supports which are used in the field of ordinary heat-sensitive recording papers can be used as the support in this invention.

A diazo compound contained in the recording layer of the light-sensitive heat-sensitive recording material which is used in this invention is a diazonium salt represented by the formula

wherein Ar represents an aromatic moiety, N$_2^+$ represents a diazonium group, and X$^-$ represents an acid anion, and the diazo compound can be colored by causing a coupling reaction with the coupling component.

The aromatic moiety is preferably represented by the following formula

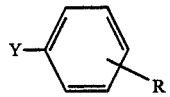

wherein Y represents a hydrogen atom, a substituted amino group, an alkoxy group, an alkylaryloxy group, an arylthio group, an alkylthio group, or an acylamino group and R represents a hydrogen atom, an alkyl group, an alkoxy group, an aryloxy group, an arylamino group, or a halogen atom (e.g., iodine, bromine, chlorine, and fluorine) and R represents the bond to the diazonium group of the diazonium salt.

Preferred substituted amino groups represented by Y include a monoalkylamino group, a dialkylamino group, an arylamino group, a morpholino group, a piperidino group, and a pyrrolidino group.

In the present invention, these diazonium salts may be used singly or as a mixture thereof.

Specific examples of diazonium groups forming the diazonium salt are 4-diazo-1-dimethylaminobenzene, 4-diazo-1-diethylaminobenzene, 4-diazo-1-dipropylaminobenzene, 4-diazo-1-methylbenzylaminobenzene, 4-diazo-1-dibenzylaminobenzene, 4-diazo-1-ethylhydroxyethylaminobenzene, 4-diazo-1-diethylamino-3-methoxybenzene, 4-diazo-1-dimethylamino-2methylbenzene, 4-diazo-1-benzoylamino-2,5-diethoxybenzene, 4-diazo-1-morpholinobenzene, 4-diazo-1-morpholino-2,5-diethoxybenzene, 4-diazo-1-morpholino-2,5-dibutoxybenzene, 4-diazo-1-anilinobenzene, 4-diazo-1-toluylmercapto-2,5-diethoxybenzene, 4-diazo-1,4-methoxybenzoylamino-2,5-diethoxybenzene, 1-diazo-4-(N,N-dioctylcarbamoyl)benzene, 1-diazo-2octadecyloxybenzene, 1-diazo-4-(4-tert-octylphenoxy) benzene, 1-diazo-4-(2,4-di-tert-amylphenoxy)-benzene, 1-diazo-2-(4-tert-octylphenoxy)benzene, 1-diazo-5-chloro-2-(4-tert-octyl-phenoxy) benzene, 1-diaxo-2,5-bis-octadecyloxybenzene, 1-diazo-2,4-bis-octadecyloxybenzene, and 1-diazo-4-( N-octanoylamino) benzene.

Specific examples of the acid anion represented by X⁻ are $C_nF_{2n+1}COO^-$ (n represents 3 to 9), $C_mF_{2m+1}SO_3^-$ (m represents 2 to 8), $ClF_{2l+1}SO_2)_2CH^-$ (l represents 1 to 18),

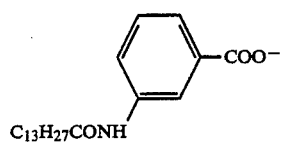

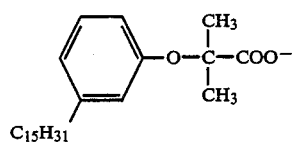

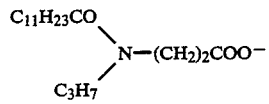

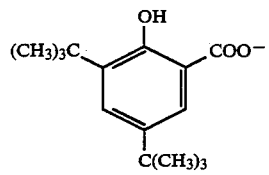

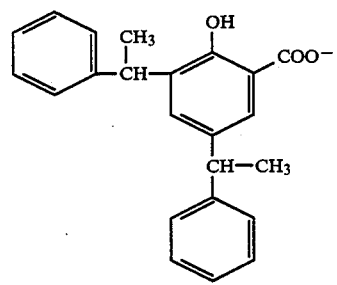

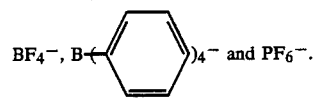

$BF_4^-$, $B(\text{—}\phi\text{—})_4^-$ and $PF_6^-$.

Specific examples of the diazo compound (diazomium salt) for use in this invention are illustrated below.

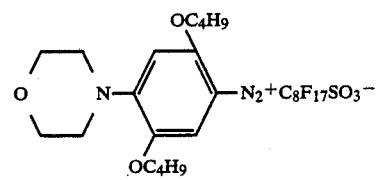

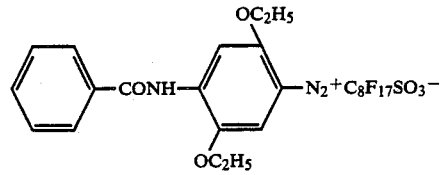

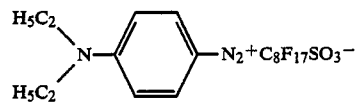

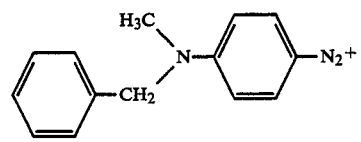

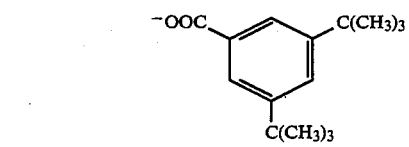

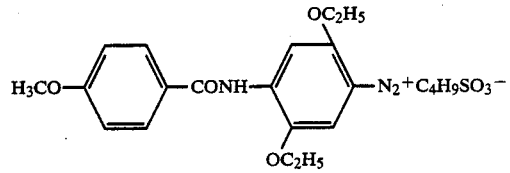

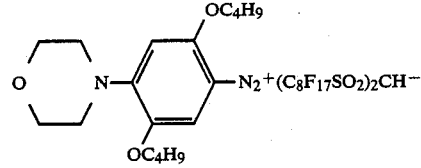

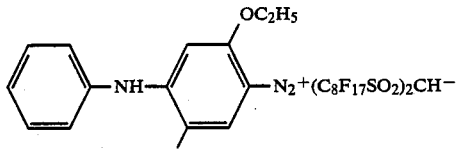

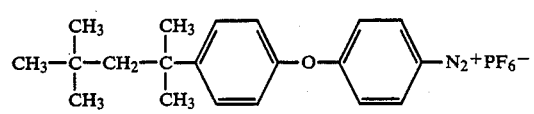

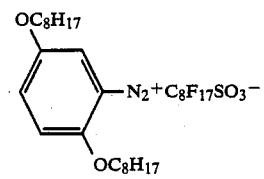

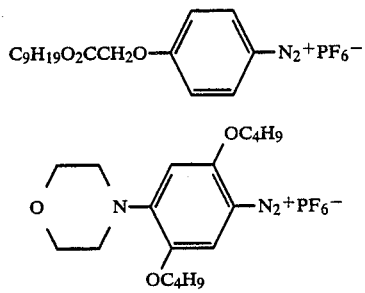

The coupling component for use in this invention is a component forming a dye by causing coupling with the aforesaid diazo compound (diazonium salt) and specific examples thereof are resorcinol, fluoroglycin, sodium 2,3-dihydroxynaphthalene-6-sulfonate, 1-hydroxy-2-naphthoic acid morpholinopropylamide, 1,5-dihydroxynaphthalene, 2,3-dihydroxynaphthalene, 2,3-dihydroxy-6-sulfanylnaphthalene, 2-hydroxy-3-naphthoic acid morpholinopropylamide, 2-hydroxy-3-naphthoic acid-2'-methylamide, 2-hydroxy-3-naphthoic acid ethanolamide, 2-hydroxy-3-naphthoic acid octylamide, 2-hydroxy-3-naphthoic acid N-dodecyloxypropylamide, 2-hydroxy-3-naphthoic acid tetradecylamide, acetanilide, acetoacetanilide, benzoylacetanilide, 1-pnenyl-3-methyl-5-pyrazolone, 2,4-bis(benzoylacetamino)toluene, 1,3-bis(pivaloylacetaminomethyl)benzene, 1-(2',4',6'-trichlorophenyl)-3-benzamido -5-pyrazolone, 1-(2',4',6'-trichlorophenyl) -3-anilino-5-pyrazolone, and 1-phenyl-3-phenylacetamido-5-pyrazolone.

Furthermore, by using two or more kinds of these components, a color image of an optional tone can be obtained.

It is preferred that the recording layer of the light-sensitive heat-sensitive recording material for use in this invention contains a basic material for accelerating the coupling reaction by making the system basic.

As the basic material, a basic material which is sparingly soluble in water or water-insoluble and a material forming an alkali by heating may be used.

Basic materials for use in the present invention include inorganic and organic ammonium salts, organic amines, amides, urea, urea derivatives, thiourea, thiourea derivatives, thiazoles, pyrroles, pyrimidines, piperazines, guanidines, indoles, imidazoles, imidazolines, triazoles, morpholines, piperidines, amidines, formazines, pyridines, etc.

Specific examples thereof are ammonium acetate, tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methylimidazole, 2-undecylimidazoline, 2,4,5-trifuryl-2-imidazoline, 1,2-diphenyl -4,4-dimethylimidazoline, 2-phenyl-2-imidazoline, 1,2,3-triphenylguanidine, 1,2-ditolylguanidine, 1,2-dicyclohexylguanidine, 1,2,3-tricyclohexylguanidine, guanidine trichloroacetate, N,N'-dibenzylpiperazine, 4,4'-dithiomorpholine, morpholium trichloroacetate, 2-aminobenzothiazole, and 2-benzoylhydrazinobenzothiazole.

These basic materials may be used singly or as a mixture thereof.

In a preferred embodiment of the light-sensitive heat-sensitive recording material for use in the present invention, at least one of the diazo compound and the coupling component is encapsulated in microcapsules.

The microcapsules containing the reactive compound for use in this invention are obtained by, if necessary, dissolving or dispersing the reactive material as core material in a water-insoluble organic solvent followed by emulsification, and forming microcapsule walls around the core materials by polymerization.

An organic solvent having boiling point of at least 180° C. is preferred as the solvent for the aforesaid purpose. These organic solvents include phosphoric acid esters, phthalic acid esters, other carboxylic acid esters, aliphatic acid amides, alkylated biphenyls, alkylated phenols, chlorinated paraffins, alkylated naphthalenes, diarylethanes, etc.

Specific examples thereof are tricresyl phosphate, trioctyl phosphate, octyldiphenyl phosphate, tricyclohexyl phosphate, dibutyl phthalate, dioctyl phthalate, dilauryl phthalate, dicyclohexyl phthalate, butyl oleate, diethylene glycol dibenzoate, dioctyl sebacate, dibutyl sebacate, dioctyl adipate, trioctyl trimellitate, acetyltriethyl citrate, octyl maleate, dibutyl maleate, isopropylbiphenyl, isoamylbiphenyl, chlorinated paraffin, diisopropylnaphthalene, 1,1'-ditolylethane, 2,4-di-tert-aminophenol, N,N-dibutyl -2-butoxy-5-tert-octylaniline, N,N'-diphenylamidine, N,N',N'-triphenylbenzamizin, and N,N'-diphenylbenzamizin.

In these solvents, ester-containing solvents such as butyl phthalate, tricresyl phosphate, diethyl phthalate, and dibutyl maleate are particularly preferred.

Preferred microcapsules in this invention are prepared by emulsifying a core material containing a reactive material and thereafter forming walls of a polymer around the oil drops. In this case, the reactant(s) for forming the polymer are added to the inside of the oil drops and/or the outside of the oil drops. Specific examples of the polymer are polyurethane, polyurea, polyamide, polyester, polycarbonate, urea-formaldehyde resin, melamine resin, polystyrene, a styrene methacrylate copolymer, a styreneacrylate copolymer, gelatin, polyvinylpyrrolidone, polyvinyl alcohol, etc.

The polymers described above may be used singly or as a mixture thereof.

Preferred polymers are polyurethane, polyurea, polyamide, polyester, and polycarbonate and particularly preferred polymers are polyurethane and polyurea.

Specific examples of the microcapsulation technique and compounds for use therefor are described in U.S. Pat. Nos. 3,726,804 and 3,796,669.

It is preferred that at least one of the diazo compound and the coupling component which are used for the heat-sensitive material is used as the core material of microcapsules. When these components are incorporated in core materials of microcapsules, these core materials may exist in the same microcapsules or in different microcapsules. However, the diazo compound and the coupling component are not contained in the same microcapsules at the same time. Other components which are not contained in the core material of microcapsules are used for the heat-sensitive layer outside the microcapsules.

Also, it is preferred to use the coupling material in an amount of from 0.1 to 30 parts by weight and the basic material in an amount of from 0.1 to 30 parts by weight per 1 part by weight of the diazo compound. Also, the diazo compound is preferably coated at from 0.05 to 5.0 g/m².

For preparing the light-sensitive material for use in the present invention, a suitable binder can be used.

As the binder, various kinds of emulsions of polyvinyl alcohol, methylcellulose, carboxymethylcellulose, hydroxypropylcellulose, gum arabic, gelatin, polyvinylpyrrolidone, casein, styrene-butadiene latex, acylonitrilebutadiene latex, polyvinyl acetate, polyacrylic acid ester, ethylenevinyl acetate copolymer, etc., can be used. The amount thereof is from 0.5 to 20 g/m$^2$, and preferably from 0.5 to 5 g/m$^2$ as solid components.

In the present invention, for the light-sensitive heat-sensitive materials, an acid stabilizer such as citric acid, tartaric acid, oxalic acid, boric acid, phosphoric acid, pyrophosphoric acid, etc., can be further used.

The light-solubilizing color image-forming material for use in the present invention is explained below.

As the support for the color image-forming material, various kinds of the supports as described, for example, in Japanese Pat. Application (OPI) No. 97140/84 (corresponding to U.S. Pat. No. 4,482,625) can be used. Specific examples of the support are films of polyethylene terephthalate, polypropylene, polyethylene, polyvinyl chloride, polystyrene, polycarbonate, triacetate, etc. In particular, a biaxially stretched polyethylene terephthalate film is excellent in strength, heat resistance, dimensional stability, transparency, etc. There is no particular restriction on the thickness of the support, but the thickness is preferably from about 10 μm to about 150 μm.

A high molecular weight organic polymer layer containing the coloring material for use in this invention is formed on the support.

The organic high molecular weight polymer layer is a layer composed of the coloring material and a binder (organic high molecular weight polymer) containing it. There is no particular restriction on the coloring material being contained in the organic high polymer layer if the coloring material is soluble in organic solvent and the coloring material can preferably be selected from various dyes and pigments. Specific examples thereof are the various pigments and dyes described in U.S. Pat. No. 4,472,494, Japanese Pat. Application (OPI) Nos. 89916/77, 117142/80 and 127552/80, and *Colour Index*, published by The American Association of Textile Chemists and Colorists, 2nd ed. (1956).

In particular, when the present invention is applied to color proofs for printing, it is preferred to use pigments for matching the color reproducibility with prints.

Also, various polymers as described, for example, in Japanese Pat. No. Application (OPI) No. 97140/82 (corresponding to U.S. Pat. No. 4,482,625) can be used as the organic high molecular weight polymer for containing the coloring material. Since it is preferred that a light-sensitive layer containing a naphthoquinonediazide series photosensitive material as described hereinafter and the coloring material layer can be developed by one bath, it is preferred to use an alkali-soluble organic high molecular weight polymer.

Examples of the alkali-soluble high molecular weight polymer are polymers having a salt-forming group described in U.S. Pat. No. 2,893,368, cellulose polymers having an acid group described in U.S. Pat. No. 2,927,022, copolymers such as methyl methacrylate/methacrylic acid copolymer described in West German Pat. Application (OLS) No. 2,123,702, acid containing polymers such as styrene/mono-n-butyl maleate copolymer and vinyl acetate/crotonic acid copolymer described in West German Pat. Application (OLS) No. 2,205,146, free carboxylic acid-containing vinyl addition polymers such as copolymers of acrylic acid and one or more alkyl acrylates described in West German Pat. Application (OLS) No. 2,320,849, and methacrylic acid-aralkyl methacrylate copolymers described in Japanese Pat. Publication No. 44615/84.

Also, the organic high molecular weight polymers (binders) described in U.S. Pat. No. 4,472,494, Japanese Pat. Application (OPI) Nos. 16124/72, 89916/77, 117142/80, and 127552/80, phenol resins, rosin, polyhydroxystyrene, etc., can be used as the polymers.

In addition, the coloring material layer can further contain, if necessary, additives such as a plasticizer, a pigment dispersion stabilizer, a surface active agent, etc.

In the case of forming the organic high molecular weight polymer layer containing a coloring material (coloring material layer), the aforesaid coloring material and binder are first dissolved in a proper solvent to provide a coating composition for forming the organic high molecular weight polymer latex (coloring material layer).

As the solvent for preparing the aforesaid coating composition, there are, for example, ketones such as acetone, methyl ethyl ketone, cyclohexanone, etc.; acetic acid esters such as methyl acetate, ethyl acetate, etc.; ethers such as methylcellosole, dioxane, tetrahydrofuran, etc.; and methylene chloride and diacetone alcohol. They may be used singly or as a mixture thereof.

The coloring material layer can be formed by coating the aforesaid coating composition on a support by an ordinary coating means such as whirler, etc.

The content of the coloring material to the binder for the organic high molecular weight polymer layer depends upon the kind of desired image-forming material, but is generally from 5 to 50% by weight based on the amount of the binder. When the invention is applied to a non-silver salt system light-sensitive film for making duplicates, a sufficient optical density is required and hence a large amount of the coloring material is used. When the invention is applied for making color proofs, etc., for the aforesaid overlay method, the optical density may be relatively low and hence the amount of the coloring material may be small.

The thickness of the organic high molecular weight polymer layer (coloring material layer) is preferably in the range of from 0.1 μm to 10 μm, and particularly preferably in the range of from 0.1 μm to 3 μm.

The light-sensitive layer of the light-solubilizing color image-forming material for use in this invention is effective in the layer containing a photosensitive naphthoquinonediazide ester compound in a high molecular weight polymer (binder).

Various naphthoquinonediazide ester compounds for the light-solubilizing image-forming material are known. For example, these photosensitive naphthoquinonediazide ester compounds are described in Japanese Pat. Publication Nos. 22062/61, 1953/62, 3627/62, 13109/62, 15665/62, 18015/63, 12083/63, 21093/65, 26126/65, 27345/70, 3801/65, 1844:5/69, 5604/70, and 13013/76.

In addition, as the photosensitive material for the light-sensitive layer, other photosensitive compositions than the photosensitive naphthoquinone diazide ester compound may be used. Typical examples thereof are combinations of a compound generating an acid by the photodecomposition thereof with an acetal or an O,N-acetal compound described in Japanese Pat. Application (OPI) No. 89003/73, with an ortho ester compound or an amidoacetal compound described in Japanese Pat. Application (OPI) No. 120714/76, with a polymer having an acetal group or a ketal group at the main chain described in Japanese Pat. Application (OPI) No. 133429/78, with an enol ether compound described in Japanese Pat. Application (OPI) No. 12995/80, with an N-acyliminocarbonic acid compound described in Japanese Pat. Application (OPI) No. 126236/80, with a polymer having an ortho ester group at the main chain described in Japanese Pat. Application (OPI) NO. 17345/81, and with a disolfone compound described in Japanese Pat. Application (OPI) NO. 166544/86. Specific examples of the compound generating an acid by the photodecomposition thereof are illustrated below, but they are not to be construed as being limited to these compounds.

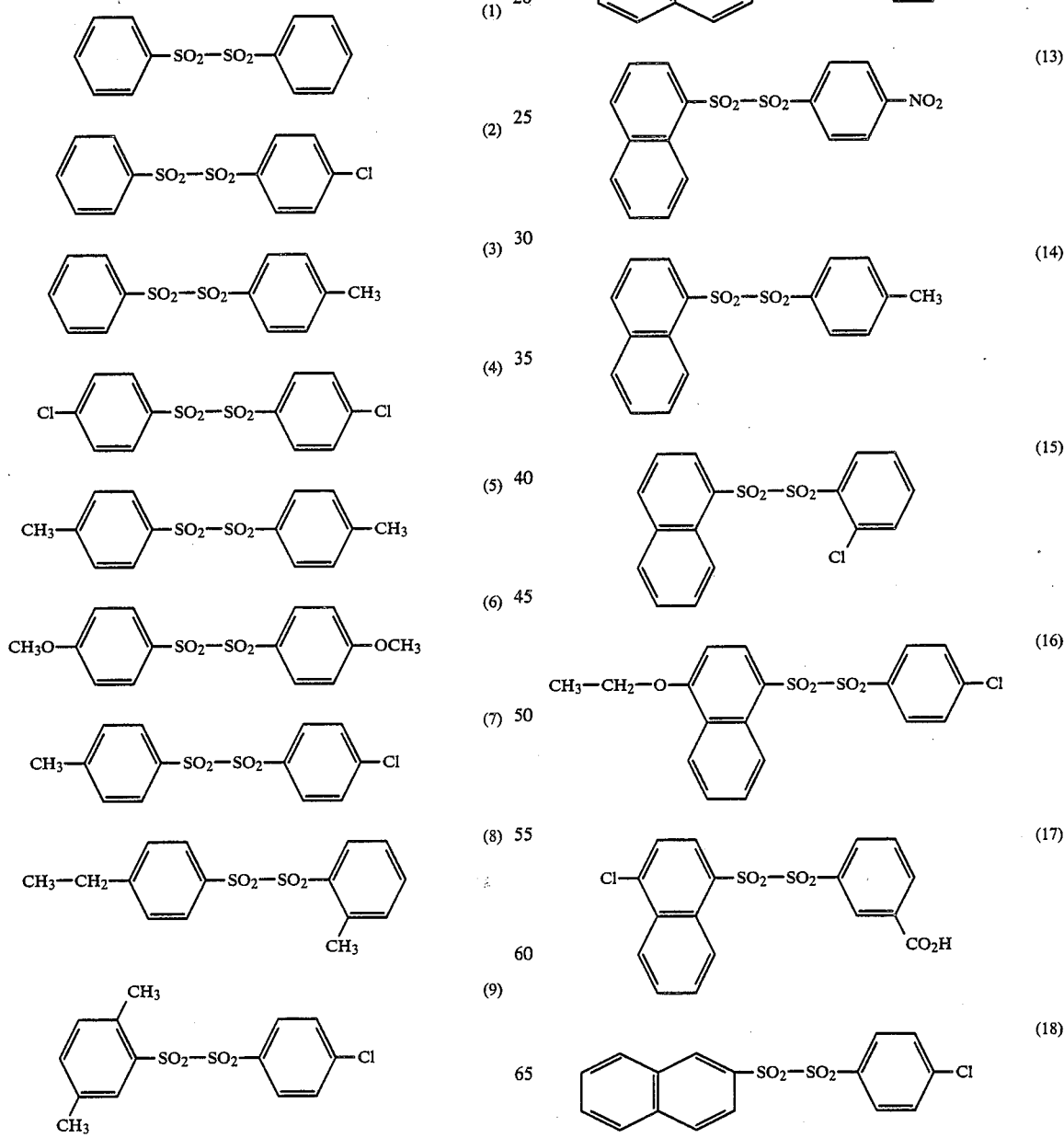

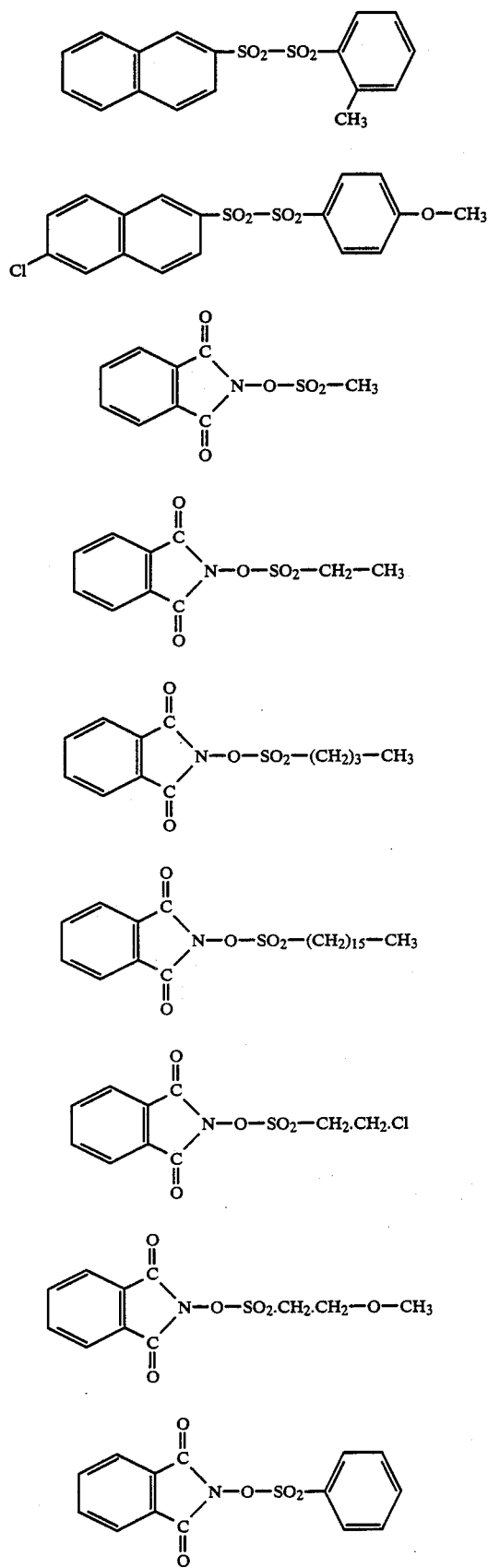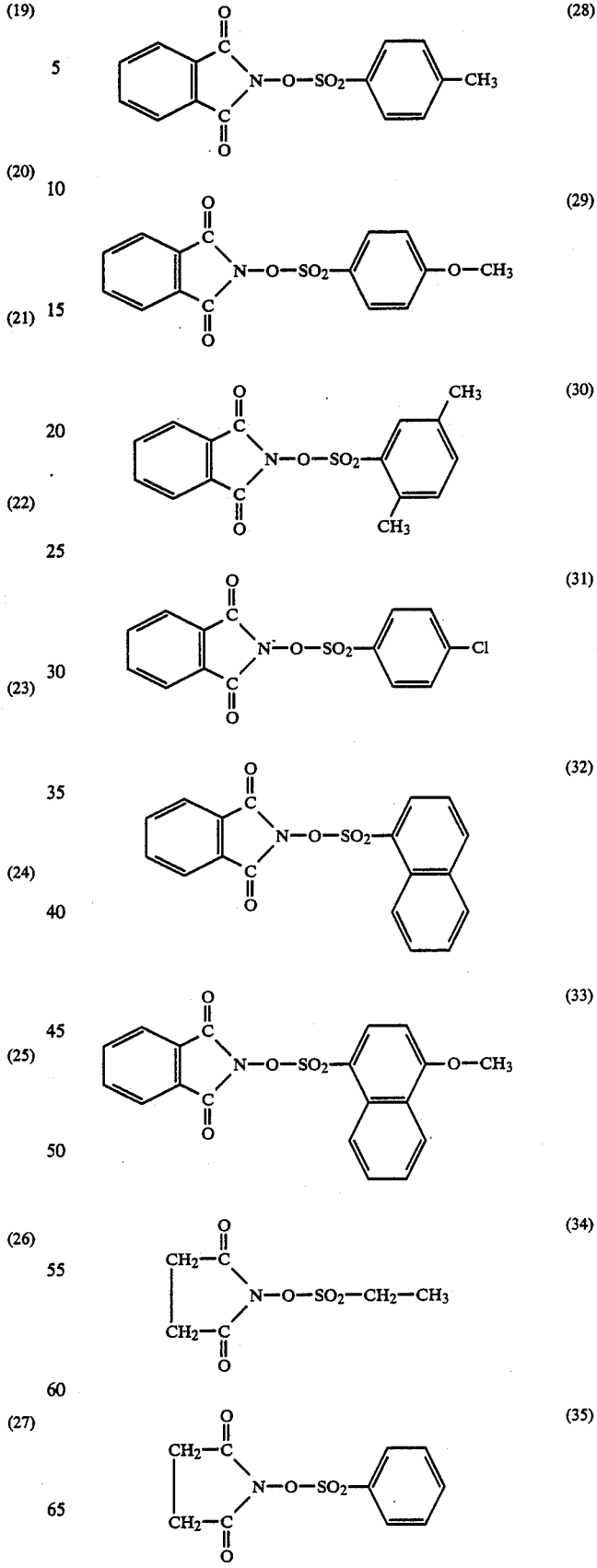

(36) 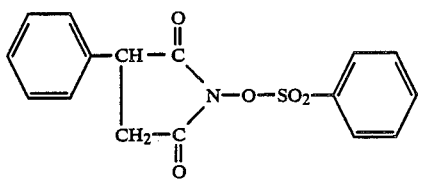

(37) 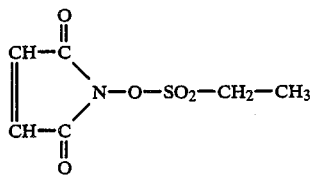

(38) 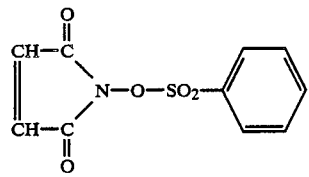

(39) 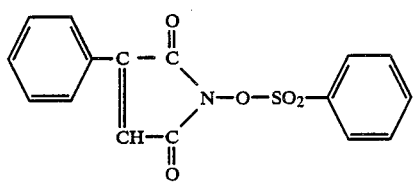

(40) 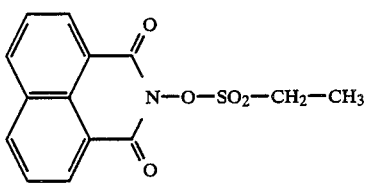

(41) 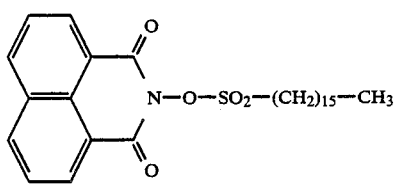

(42) 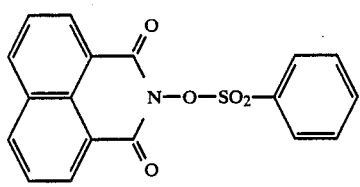

(43) 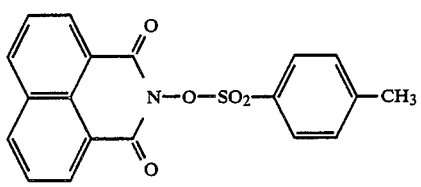

It is preferred that the high molecular weight polymer having a function as a tender is alkali-soluble and as such a polymer, a novolak resin is frequently used. Specific examples of a novolak resin are described in U.S. Pat. Nos. 3,184,310 and 3,535,157, Japanese Pat. Publication Nos. 7482/75, 8658/75 and 14042/76, and Japanese Pat. Application (OPI) No. 48403/74.

Also, a mixture of the novolak resin and other high molecular weight compounds can be used and examples of such a mixture are described in U.S. Pat. No. 3,535,157, French Pat. 1,542,334, and Japanese Pat. Publication Nos. 16259/66, 24323/69, and 36961/74.

It is preferred that the ratio (weight ratio) of the photosensitive naphthoquinonediazide ester, which is used for the light-sensitive layer of the light-solubilizing color image-forming material in this invention, to the binder is in the range of from 0.10/1 to 0.5/1.

Also, it is preferred that the thickness of the light-sensitive layer is in the range of from 0.1 $\mu$m to 10 $\mu$m.

In addition, the coloring material layer and the light-sensitive layer of the light-solubilizing color image-forming material may be combined into one layer as a coloring material-containing light-sensitive layer. The construction and materials for such a coloring material-containing light-sensitive layer are known as described in Japanese Pat. Application (OPI) NO. 97140/84 and in the case of forming a coloring material-containing light-sensitive layer in the light-solubilizing color image-forming material for use in the present invention, the coloring material-containing light-sensitive layer can be easily formed by referring to the above-described examples of the constituting components and known techniques as described in Japanese Pat. Application (OPI) No. 97140/84.

In the light-solubilizing color image-forming material for use in this invention, a peelable layer may be formed between the support and the coloring material layer for, if necessary, transferring the images formed.

The constitution and materials therefor of the peelable layer formed on the support are known as described in Japanese Pat. Application (OPI) Nos. 188537/86 and 134482/87. The material for the peelable layer is generally selected from organic polymers which are not tacky at room temperature, but show tackiness and fusibility when heat is applied, and can be released from the support.

The materials for forming the peelable layer are described, for example, in Japanese Pat. Application (OPI) NO. 97140/84 (corresponding to U.S. Pat. No. 4,482,625). Specific examples thereof include polyacrylic acid esters, acrylic acid ester copolymers, polymethacrylic acid esters, methacrylic acid ester copolymers, polyacrylamide, acrylamide copolymers, polyvinyl acetate, vinyl acetate copolymers, polyvinyl chloride, vinyl chloride copolymers, polyvinylidene chloride, vinylidene chloride copolymers, polystyrene, styrene copolymers, ethylene copolymers (e.g., ethylene-vinyl acetate copolyxer, ethylene-acrylic acid ester copolymer, ethylene-vinyl chloride copolymer, and ethylene-acrylic acid copolymer), polyvinyl acetals (e.g., polyvinyl butyral, and polyvinyl formal), polyester resins, polyamide resins (e.g., nylon and copolymerized nylon), various rubbers (e.g., synthetic rubber and chlorinated rubber), and polyolefins (e.g., polyethylene and polypropylene).

The aforesaid polymers or resins may be used singly or as a mixture thereof. Also, the peelable layer may be composed of two or more layers. Furthermore, if desired, the peelable layer may contain various additives, such as a tackifier, a plasticizer, etc.

For forming the peelable layer on the support, a solution of the aforesaid high molecular weight material is coated on the support by an ordinary manner followed by drying, the aforesaid high molecular weight material is melted by heating and coated on the support (hot melt coating), or a film of the aforesaid high molecular weight material is laminated on the support.

The thickness of the peelable layer is preferably in the range of from 0.2 μm to 10 μm.

The image-exposure steps and development steps for the light-sensitive heat-sensitive recording material and the light-solubilizing color image-forming material in the present invention can be performed according to known methods.

That is, after contact exposure from a positive image, for example, a color separation positive image, a wet development (e.g., using a developer) or a dry development (e.g., using heat) may be applied. The image formation of the light-solubilizing color image-forming material can be performed by referring to the description of Japanese Pat. Application (OPI) No. 97140/84.

The following examples serve to illustrate the present invention, but these examples should not be construed as limiting the scope of the invention. Unless otherwise specified, all parts, percents, ratios and the like are by weight.

EXAMPLE 1

(A) Light-Sensitive Heat-Sensitive Recording Material

In a mixture of 24 g of tricresyl phosphate and 5 g of ethyl acetate were dissolved 3.45 g of the diazo compound shown below and 18 g of an adduct of xylylene diisocyanate and trimethylolpropane (3:1). The solution of diazo compound was dispersed by emulsification in an aqueous solution of 5.2 g of polyvinyl alcohol dissolved in 58 g of water at 20° C. to provide an emulsion having a mean particle size of about 2.5 μm. After adding 100 g of water to the emulsion thus obtained, the mixture was heated to 60° C. with stirring, whereby a microcapsule liquid containing the diazo compound as the core material was obtained ater 2 hours.

Diazo Compound

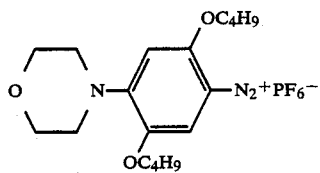

Then, 10 g of 2-hydroxy-3-naphtholic acid anilide, 10 g of triphenyl guanidine, and 40 g of hydroquinone monobenzyl ether were added to 200 g of an aqueous solution of 5% polyvinyl alcohol and they were dispersed for about 10 minutes by Dyno Mill (trade name, made by Willy A. Bachofen A.G.) to provide a dispersion of the coupling component and triphenyl guanidine having a mean particle size of about 2 μm.

Then, 50 g of the microcapsule liquid of the diazo compound thus obtained was mixed with 50 g of the dispersion of the coupling component, triphenyl guanidine, and hydroquinone monobenzyl ether obtained above to provide a coating composition. The coating composition thus obtained was coated on a flat wood-free paper of 50 g/m² using a coating bar at a dry thickness coating weight of 10 g/m² and dried for one minute at 25° C. to provide a light-sensitive heat-sensitive recording material.

(B) Light-Solubilizing Color Image-Forming Material

First, for forming a coloring material layer, mother liquid A having the following formula for dispersing pigment was prepared.

Mother Liquor A

| | |
|---|---|
| Styrene-Maleic Acid Copolymer Resin (Oxylack SH-101 represented by the following formula, trade name, made by Nippon Shokubai Kagaku Kogyo, Co., Ltd.; mean molecular weight: 9,000; m.p.: about 190° C.) | 20 g |
| $\mathrm{+CH_2-CH)_{50}(CH-CH)_{50}}$ with phenyl, COOH, and CH(CH$_3$)(CH$_3$) groups | |
| Methyl Ethyl Ketone | 80 g |

Then using mother liquor A, a pigment dispersion having the following composition for forming a coloring material layer was prepared.

Coloring Material Layer Forming Coating Liquid

| | |
|---|---|
| Mother Liquor A | 110 g |
| Methyl Ethyl Ketone | 40 g |
| Methylcellosolve Acetate | 25 g |
| Seika Fast Yellow H-0755 (trade name, made by Dainichiseika Color & Chemicals Mfg. Co., Ltd., C.I. No. 21095) | 14.6 g |
| Seika Fast Carmin 1483 (trade name, made by Dainichiseika Color & Chemicals Mfg. Co., Ltd., C.I. No. 15850) | 9.8 g |

The aforesaid dispersion was prepared by dispersing the above components for 3 hours by a dispersing machine for experiment (paint shaker, made by Toyo Seiki K.K.).

Then, a diluent having the following composition for diluting the pigment dispersion was prepared.

| | |
|---|---|
| Methyl Ethyl Ketone | 550 g |
| Methylcellosolve Acetate | 130 g |
| Fluorine Series Surface Active Agent (Fluorad FC-430, trade name, made by Sumitomo 3M Co.) | 2 g |

After diluting the aforesaid pigment dispersion with the aforesaid diluent, the dispersion thus diluted was stirred for 10 minutes and then subjected to ultrasonic treatment for 10 minutes to provide a coating liquid for the color material layer. After filtering the coating liquid for the coloring material layer with Filter No. 63 (made by Toyo Roshi K.K.). The coating liquid was coated on a support using whirler and dried for 2 minutes at 100° C. to form a coloring material layer shown below.

Coloring Material Layer

| | |
|---|---|
| Pigment Dispersion/Diluent | 3.5 g/46.5 g — |
| Layer Thickness | 1.0 μm |

-continued

| | |
|---|---|
| Optical Density (blue filter) | 0.4 |

Furthermore, a light-sensitive liquid having the following composition was coated on the coloring material layer with whirler after filtering with the aforesaid Filter No. 63 and dried for 2 minutes at 100° C. (dry thickness: 1.0μm) to form a light-sensitive layer.

| | |
|---|---|
| Addition product of Condensate (mean polymerization degree: (3) of Acetone and Pyrogallol and 2-Diazo-1-naphthol-4-sulfonyl Chloride | 15 g |
| Novolak Type Phenol Formaldehyde Resin (PR-50716, trade name, made by Sumitomo Duress Co., Ltd.; mean molecular weight: about 650; m.p.: about 80° C.) | 30 g |
| Tricresyl Phosphate | 5 g |
| n-Propyl Acetate | 280 g |
| Cyclohexanone | 120 g |

Thus, a light-solubilizing color image-forming material having the coloring material and the light-sensitive layer formed, in succession, on the support was prepared.

The light-sensitive heat-sensitive recording material prepared above was image-exposed with a 1 kW super high-pressure mercury lamp P-607W (trade name, made by Dainippon Screen Mfg. Co., Ltd.) using a color-separated positive for blue print for 45 seconds and then heat-developed using a color art transferring machine (laminator) CA600T (trade name, made by Fuji Photo Film Co., Ltd.) under 450 mm/min. at 125° C. to provide a clear blue positive image.

On the other hand, the light-solubilizing color image-forming material prepared above was image exposed with a 1 kW super high-pressure mercury lamp P-607W (trade name, by Dainippon Screen Mfg. Co., Ltd.) using a color-separated positive for red print for 60 seconds in a superposed state of them with the back surface of the original and the light-sensitive layer of the color image-forming material in face-to-face relationship and then developed by a color art developer CA-1 (trade name, made by Fuji Photo Film Co., Ltd.) diluted 5 times using an automatic processor (Color Art Processor CA-600P, trade name, made by Fuji Photo Film Co., Ltd.) for 34 seconds at 31° C. to provide a clear red positive image.

The light solubilizing color image-forming material having the red image was superposed on the light-sensitive heat-sensitive recording material having the blue image thus obtained as described above while matching the positions of both the images and they were laminated using a color art transferring machine (laminator) CA-600T (trade name, made by Fuji Photo Film Co., Ltd.) to form an image of red and blue having excellent color reproducibility.

EXAMPLES 2 AND 3

By following the same procedure as Example 1 except that as the coupling component for the coating liquid of the light-sensitive heat-sensitive recording material, a mixture of 8.7 g of 2-hydroxy-3-naphthoic acid anilide and 1.3 g of 2,4-dibenzoylacetylaminotoluene (Example 2) or a mixture of 4.0 g of 2-hydroxy-3-naphthoic acid benzylamide and 6.0 g of 1,2-ethylenebispivaloylacetamide (Example 3) was used, and further at the image-exposure of the light-sensitive heat-sensitive recording material, a black positive print (Example 2) or a green positive print (Example 3) was used as an original to provide, thus, a red-black image and a red-green image, each having excellent color reproducibility.

EXAMPLE 4

A light-sensitive heat-sensitive recording material was prepared by the same manner as Example 1 and a blue image was formed using the recording material by the same manner as in Example 1.

A light-solubilizing color image-forming material was prepared as follows.

First, a coating liquid having the following composition for forming a peelable layer was prepared.

| | |
|---|---|
| Alcohol-Soluble Polyamide (CM-8000, trade name, made by Toray Industries, Inc., "η" = 23 cps (in 10 wt % methanol solution at 20° C.; m.p.: about 128° C.; specific gravity: 1.12) | 7.2 g |
| Polyhydroxystyrene (Resin M, trade name, made by Maruzen Oil Co. Ltd., mean molecular weight: 5,500) | 1.8 g |
| Methanol | 400 g |
| Methylcellosolve | 100 g |

The coating liquid was uniformly coated on a polyethylene terephthalate film (support) of 75 μm in thickness and dried to form a peelable layer having a dry thickness of 0.5 μm.

Then, for forming a coloring material layer, mother liquor A having the following formula for pigment dispersion was prepared.

Mother Liquor A

| | |
|---|---|
| Styrene-Maleic Acid Copolymer Resin (Oxylack SH-101, trade name, made by Nippon Shokubai Kagaku Kogyo K. K.) | 20 g |
| Methyl Ethyl Ketone | 80 g |

Then, two kinds of dispersions of pigments each having each different color having following compositions were prepared using mother liquor A prepared above.

Yellow Coloring Material Layer-Forming Coating Liquid

| | |
|---|---|
| Mother Liquor A | 110 g |
| Methyl Ethyl Ketone | 40 g |
| Methylcellosolve Acetate | 25 g |
| Seika Fast Yellow H-0755 (trade name, made by Dainichiseika Color & Chemicals Mfg. Co., Ltd.) | 24.4 g |

Magenta Coloring Material Layer-Forming Coating Liquid

| | |
|---|---|
| Mother Liquor A | 110 g |
| Methyl Ethyl Ketone | 40 g |
| Methylcellosolve Acetate | 25 g |
| Seika Fast Carmin 1483 (trade name, made by Dainichiseika Color & Chemicals Mfg. Co., Ltd.) | 12.2 g |

Each dispersion was prepared by dispersing the above components for 3 hours using a dispersing machine for experiment (paint shaker, made by Toyo Seiki K.K.).

Then a diluent having the following formula for diluting the pigment dispersions was prepared.

| Methyl Ethyl Ketone | 550 g |
|---|---|
| Methylcellosolve Acetate | 130 g |
| Fluorine Series Surface Active Agent (Fluorad FC-430, trade name, made by Sumitomo 3M Co.) | 2 g |

After diluting each of the pigment dispersions with the aforesaid diluent at a rate shown below, the dispersion thus diluted was stirred for 10 minutes and then subjected to a ultrasonic treatment for 10 minutes to provide each coating liquid for a coloring material layer.

After filtering each coating liquid for the coloring material layer with Filter No. 63 (trade name, made by Toyo Roshi K.K.), the coating liquid of each color was coated on each support having the peelable layer described above using whirler and dried for 2 minutes at 100° C. to form each coloring material layer of each color.

Yellow Layer

| Pigment Dispersion/Diluent | 3.5 g/46.5 g |
|---|---|
| Layer Thickness | 1.0 μm |
| Optical Density (blue filter) | 0.5 |

Magenta Layer

| Pigment Dispersion/Diluent | 4 g/46 g |
|---|---|
| Layer Thickness | 0.7 μm |
| Optical Density (green filter) | 0.75 |

Furthermore, a light-sensitive liquid having the following composition was coated on each coloring material layer of each color thus formed by whirler after filtering with aforesaid Filter No. 63 and dried for 2 minutes at 100° C. to form a light-sensitive layer (dry thickness of 1.0 μm).

| Addition Product of Condensate of Acetone and Pyrogallol (mean polymerization degree: (3) and 2-Diazo-1-naphthol-4-sulfonyl Chloride | 15 g |
|---|---|
| Novolak Type Phenol-Formaldehyde Resin (PR-50716, trade name, made by Sumitomo Duress Co.) | 30 g |
| Tricresyl Phosphate | 5 g |
| n-Propyl Acetate | 280 g |
| Cyclohexanone | 120 g |

As described above, each light-solubilizing color image-forming material of each color having the peelable layer containing the alcohol-soluble polyamide, the coloring material layer, and the light-sensitive layer formed, in succession, on the support was obtained.

Each of the two kinds of light-solubilizing color image-forming materials thus prepared was image-exposed to an original using each corresponding color separation mask with a 1 kW super high-pressure mercury lamp 0-607Fw (trade name, made by Dainippon Screen Mfg. Co., Ltd.) for 60 seconds. The original was superposed on the image-forming material with the back surface of the original and the light-sensitive layer of the color image-forming material in a face-to-face relationship and then developed by an automatic processor (Color Art Processor CA-600P, trade name, made by Fuji Photo Film Co., Ltd.) with a color art developer CA-1 (trade name, made by Fuji Photo Film Co., Ltd.) diluted 5 times for 34 seconds at 31° C. to provide clear yellow and red images, respectively.

Then, the light-sensitive heat-sensitive recording material having the blue image described above was superposed on the light-solubilizing color image-forming material having the red color described above while matching the positions of both the images, they were laminated using a color art transferring machine CA-600T (laminator) (trade name, made by Fuji Photo Film Co., Ltd.), and then the support for the light-solubilizing color image-forming material having the red image was peeled off to provide a two color image wherein the red image was transferred onto the blue image on the light-sensitive heat-sensitive recording material.

Then, the light-solubilizing color image-forming material having the yellow image obtained above was further superposed on the two-color image thus obtained while matching the positions of the images and they were laminated using a color art transferring machine CA-600T (laminator) (trade name, made by Fuji Photo Film Co., Ltd.) to provide an image having three colors and excellent color reproducibility.

As described above, according to the multicolor image-forming method of the present invention wherein color images are formed on a light-sensitive heat-sensitive recording material and a light-solubilizing color image-forming material, respectively, the color images thus obtained are superposed on each other, and they are pressured by heating, multicolor images can be very easily obtained at low cost and the image obtained are very excellent in color reproducibility relative to the originals. These merits satisfy both the need for a high image quality and low cost for producing the color images, which are difficult to achieve with a conventional overlay method and surprint method.

While the invention has been described in detail and with reference to specific embodiments thereof, it will be apparent to one skilled in the art that various changes and modifications can be made therein without departing from the spirit and scope thereof.

We claim:

1. A multi-color image-forming method comprising the steps of:
    (a) using a positive image, imagewise-exposing with light, a light-sensitive heat-sensitive material comprising a support having provided thereon, a recording layer comprising a diazonium compound and a coupling component capable of forming a dye upon coupling with the diazonium compound, wherein at least one of the diazonium compound and the coupling component are present in microcapsules, and developing said light-sensitive heat-sensitive material to form a positive color image of said positive image;
    (b) using a positive image, imagewise-exposing with light, a light-solubilizing color image-forming material comprising a substantially transparent support having provided thereon a light-sensitive layer comprising a light-solubilizing image-forming material and a polymeric binder, and a coloring layer comprising a coloring material, and developing said light-solubilizing color image-forming material to form a positive color image of said positive image;
(c) superimposing the resulting light-solubilizing color image-forming material of step (b) on the resulting light-sensitive heat-sensitive recording material of step (a) to provide a superimposed material (d) heat-pressing the resulting superimposed material of Step (c).

2. The multi-color image-forming method according to claim 1, wherein said coloring layer and said light-sensitive layer of said light-solubilizing color image-forming material of step (b), are combined into one layer thus providing a coloring material-containing light-sensitive layer.

3. The multicolor image-forming method as claimed in claim 1, wherein a two-color image is formed.

4. The multicolor image-forming method as claimed in claim 3, wherein the light-sensitive heat-sensitive recording material forms a substantially black, blue, or green image and the light solubilizing color image-forming material forms a substantially red image.

* * * * *